TUNING MEANS

Filed April 3, 1947

2 Sheets-Sheet 1

Inventors
Bertram A. Schwarz
& Ludwig J. Fichter

By Spencer, Willits, Helwig & Baillio
Attorneys

Jan. 10, 1950 B. A. SCHWARZ ET AL 2,494,007

TUNING MEANS

Filed April 3, 1947 2 Sheets-Sheet 2

Inventors
Bertram A. Schwarz
& Ludwig J. Fichter
By
Spencer, Willits, Helwig & Baillio
Attorneys Patented Jan. 10, 1950

2,494,007

UNITED STATES PATENT OFFICE 2,494,007

TUNING MEANS

Bertram A. Schwarz, Kokomo, Ind., and Ludwig J. Fichter, Rockford, Ill., assignors to General Motors Corporation, Detroit, Mich., a corporation of Delaware Application April 3, 1947, Serial No. 739,244

4 Claims. (Cl. 74—10.33)

This invention relates to means for accurately positioning adjustable apparatus used for tuning radio receivers. In altering the tuning of radio receiving equipment so that various frequencies are utilized and the set changed to receive different stations, the resonant frequency of the receiver can be changed in the several stages necessary by either varying the inductance or capacity in that circuit. Both means are common and while the mechanism disclosed in the present application is shown associated with a variable condenser, it could as well be utilized for changing the position of means for varying inductance. Originally, most radio receivers were tuned by the manual manipulation of a knob and dial to which the capacity or inductance of the desired radio circuits were directly mechanically connected for tuning over the band to receive different stations.

Later the sets were provided with so-called "push button" tuning wherein reciprocating or pivoted buttons associated with levers were provided so that the operator by merely applying pressure to said button would immediately bring the receiver to a pre-set station. A number of these buttons were provided so that a number of favorite stations could be set up initially and upon the application of force to any one of said buttons a desired station would be brought in. Particularly in automotive receivers, however, where the locale of operation is changed frequently, it was necessary to reset the adjustable means on the various plungers to new positions for the new stations and on some of the earlier models it was necessary to remove a portion of the casing to change the cam position inside the receiver with a screw driver or similar apparatus. Later, means were provided for unlocking the cams or other adjustable indexing equipment from the outside, but in the majority of these it was still necessary to utilize both hands, one to hold the plunger in and the other to adjust and tighten the equipment for locking the cam in position.

It is therefore an object of our invention to provide pre-set indexing means which can be unlocked by the application of force additional to that ordinarily used for tuning and without the necessity of manipulating other devices.

It is a further object of our invention to provide indexing means which can be unlocked by additional travel of the plunger in the direction of movement at which time the receiver can be manually tuned to some new station and the mere removal of the additional pressure on the push button immediately locks the device in its new position, and thereafter it will return the tuning mechanism to the new station.

It is a still further object of our invention to provide pre-set push button tuning means which is spring locked and capable of unlocking on the application of force to overcome said spring pressure for re-setting.

With these and other objects in view which will become apparent as the specification proceeds, our invention will be best understood by reference to the following specification and claims and the illustrations in the accompanying drawings, in which:

Figures 1, 2, 3:
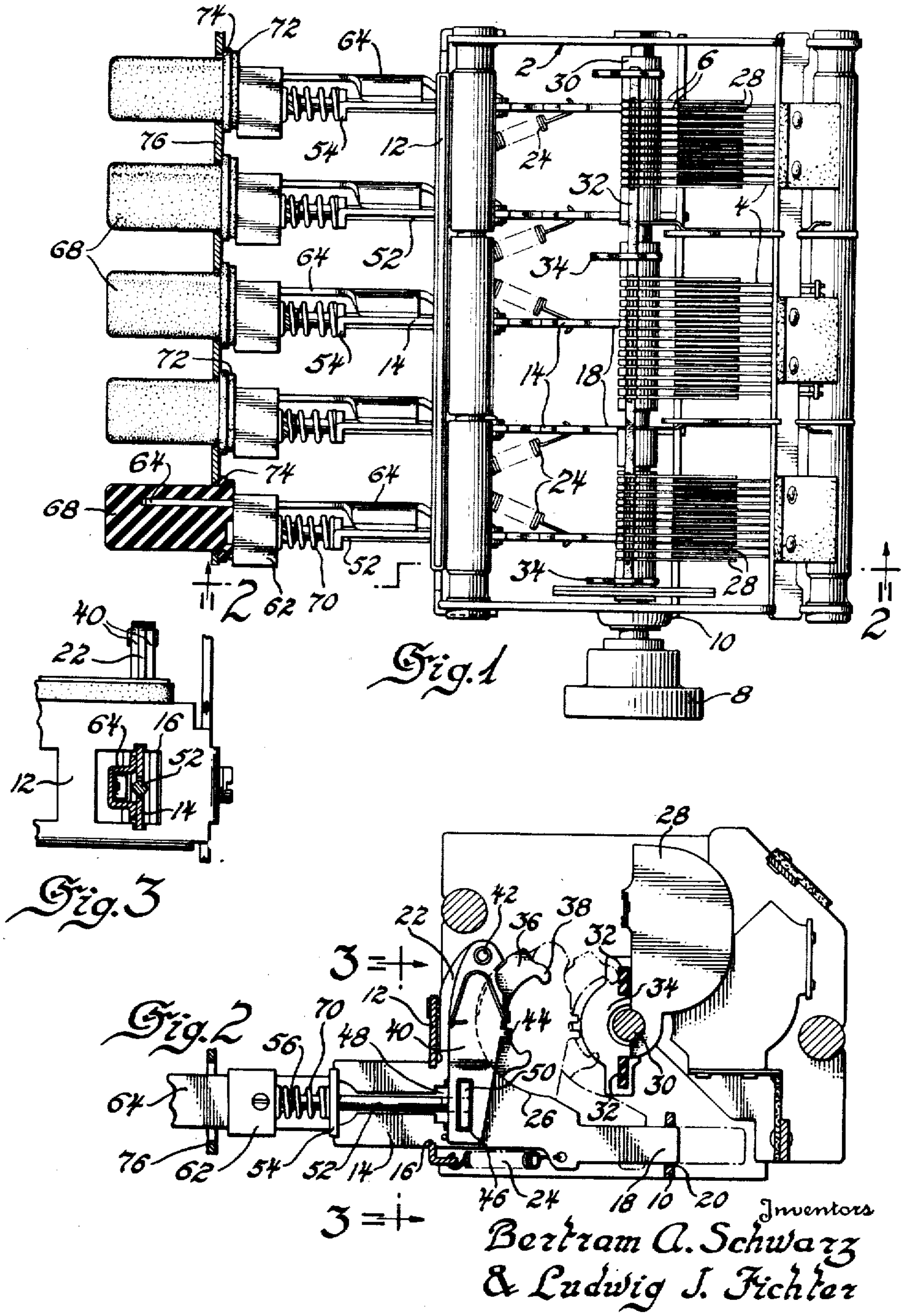
Figure 1 is a top plan view showing a tuning mechanism of our design as applied to a variable gang condenser for tuning purposes.
Figure 2 is a sectional view taken on line 2—2 of Fig. 1.
Figure 3 is a sectional view taken on line 3—3 of Fig. 2.

Referring now more particularly to that species shown in Figures 1—6, there is disclosed in Fig. 1 a variable condenser 2 consisting of a series of stator plates 4 between which lie a series of adjustable rotor plates 6 for changing the capacity in the several stages of a multi stage radio receiver for tuning purposes. The rotor shaft is provided at one end with means for manually setting the same to different positions which in this instance is shown in an exemplary form as a knob or dial 8. The frame of the condenser is provided with two upstanding portions 10 and 12 which extend for the full longitudinal length of the same and have a series of slots therein in which a series of plunger means for so-called push button tuning are mounted for reciprocation.

These plungers are all identical and one therefore will be described in detail. The reciprocating plungers or levers are of irregular shape such as shown at 14 and are made of a piece of flat material bent into the desired configuration and extending first through an opening 16 in the front wall 12 of the condenser frame and then, being reduced in vertical section to a small rear portion 18 which extends through an aligned opening 20 in the vertical plate 10 of the condenser housing or frame. Thus the member 14 may move longitudinally toward and away from the condenser per se. This member 14 is provided with an upstanding arm 22 integral therewith which in its outer-most position is adapted to press against the inner surface of the front partition 12 and act as a limit for movement in that direction. A tension spring 24 connected to the frame or partition 12 and to an opening in each member 14 is provided to bias the plunger normally to the position just identified.

The upstanding arm 22 is provided on its inner side with an arcuate surface 26 whose radius is determined by the curvature of the means for moving the rotor which is directly seated thereon. Referring more specifically to Fig. 2, the rotor plates 28 are shown as pivoted around axis 30 which is the shaft to the end of which knob 8 is applied. Parallel with the shaft and spaced on each side thereof, there are provided two insulated bars 32, which extend substantially the full length of the tuner and are connected together at various spaced points along the shaft by supporting members 34, this whole assembly being rigidly connected to the rotor plates to turn therewith. The bars 32 are adapted to be contacted by the arcuate or half-moon cams 36, which are adapated to ride in the arcuate seats 26 of the plungers, and have substantially the same curvature. Each arcuate cam is provided with two projecting points 38, which are adapated to engage either of the bars 32, depending upon which way the rotor is to be turned and to move it to its new location. Therefore, the arcuate surface 26 is determined by the radius from the center of the shaft 30 to this surface when the projecting points 38 engage the bars 32 for full in-tune position.

The means for maintaining the arcuate cam 36 in a predetermined set position on the arcuate surface 26 is a saddle 40 pivoted at 42 to the top of the projecting arm 22 and extending down on both sides of the member 14 and being cross-connected at 44 to extend over around the center of the arcuate cam 36 so that when the lower part of the saddle 40 is pulled back around its pivot 42 this section 44 will tend to force the arcuate cam 36 firmly against the surface 26 and frictionally lock the same. The portion of the saddle 40 which extends down on each side of the member 14 is provided at its lower extremity with a slotted section 46 and the slide 14 at that point is provided with an aperture 48 in which a longitudinally adjustable block 50 is positioned. This block 50 is adapated to engage the sides of the apertures 46 in the saddle and to move the saddle about its pivot as the block moves longitudinally of the plunger.

To move this block there is provided a short shaft 52 which is threaded into the block 50 and this rod or shaft runs longitudinally of the plunger and extends through and is trunnioned in an upstanding ear 54. The outer end of the shaft 52 is provided with a series of coarse spiral threads 56 which engage with the inner threaded surface 58 of a collar 60 which collar is supported within a longitudinally movable block 62. The block 62 has slots 66 which provide slideable support on guide 64 and is thus maintained against rotation. A compression spring 70 is provided around the shaft 52, and engages against the ear 54 and the inner surface of the block 62, tending to maintain the block in its projected or outermost position. Push button 68 is slideably supported on guide 64 and is restrained from removal therefrom by integral flange 72 which bears against a resilient cushioning washer 74 and panel 76.

With the plunger therefore, in its outer-most position, the saddle 40 locks the adjustable cam 36 in a definite set position on the arcuate seat 26. When the operator desires to rotate the variable condenser to tune in a station representative of the present position of the adjustable cam 26, pressure is applied to the push button 68 along its longitudinal axis. The plunger 14 then slides in axially to bring the cam 36 toward the axis of the shaft 30 and one of the ends 38 engages one of the cross members 32. When this occurs the rotary assembly begins to rotate around the axis of the shaft 30, and such action continues until the other extreme end 38 of the cam 36 engages the opposite cross member 32. This brings the rotary condenser to a definite set position and the inward motion of the plunger stops. Upon release of the manual pressure, the spring 24 immediately returns the plunger to its outermost position.

If now, however, it is desired to set this particular plunger to some new station, manual pressure is applied to the push button 68, as in previous instances, and the set is tuned to that particular position. Pressure is now increased on the end of push button 68, which action forces the block 62 inwardly, compressing spring 70. Since the interior surface of this block is provided with threads which cooperate with the spiral threads 56 on the shaft 52, the inward movement of the block 62 through these cooperating threads will cause rotation of the shaft 52, which in turn will cause a change in the relative position of said shaft 52, and said block 50, as the two are in theraded relation. This movement of the block 50 along the threads of the shaft 52 will be sufficient to unlock the saddle 40 and permit the arcuate cam 36 to slide on its seat 26. Now by the application of rotary force to the knob 8, the set may be tuned to its new station while holding the push button 68 in this position. The movement of the cross members 32 will now cause the cam 36 to move on its seat and assume a new position. When the new station has been tuned in the push button 68 may be released, the spring 70 will now force the block 62 back into its outward position, causing counter-rotation of the shaft 52 and locking action of the block 50 to again move the saddle 40 about its pivot and lock the cam 36 in its new position.

Such action, of course, can be duplicated for the other push buttons if it is desired to reset any of them. It is thus seen that normally longitudinal motion of any push button will merely tune the set to some pre-set station, but that if it is desired to change the setting of the station of any push button, additional pressure on the same push button will unlock the settable cam and the receiver may now be tuned to its new station, and upon release of this same button, the cam will now be locked to thereafter tune the set to the new station. Accidental additional pressure on one of the buttons will not detune the receiver but will only unlock the cam in its original set position which will immediately become locked upon a removal of pressure. To change the setting the manual knob must be rotated. The above construction is, of course, only one of many ways in which additional pressure on a longitudinal movable plunger may unlock a pre-settable device for resetting to a new position.

Figures 4, 5, 6, 7, 9, 10, 11:
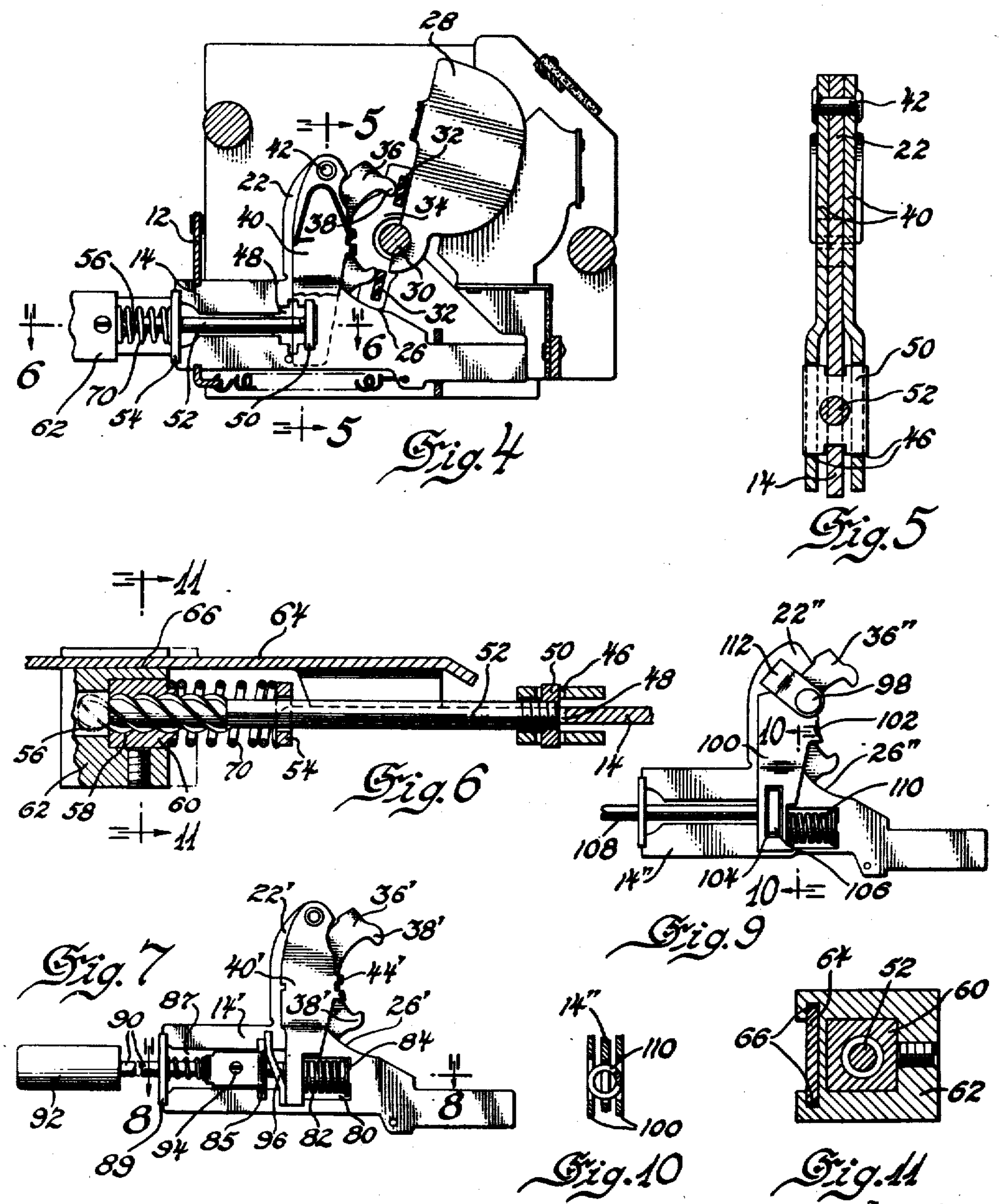
Figure 4 is a sectional view similar to Fig. 2 showing the parts of the apparatus in their in-tune or setting position.
Figure 5 is an enlarged sectional view taken on line 5—5 of Fig. 4.
Figure 6 is an enlarged sectional view taken on line 6—6 of Fig. 4.
Figure 7 is a side elevation of single tuning plunger showing a modified form of our invention.
Figure 9 is a side elevation of a further modified plunger design.
Figure 10 is a sectional view taken on line 10—10 of Fig. 9.
Figure 11 is a sectional view taken on line 11—11 of Fig. 6.
Figure 8:
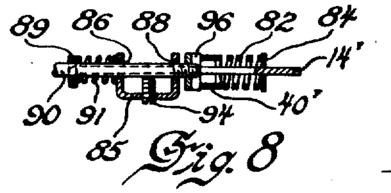
Figure 8 is a sectional view taken on line 8—8 of Fig. 7.

Figures 7 and 8 show a modified form of accomplishing that same result and in that instance only one of the like plungers is shown which would be similar to plungers 14 shown in the preceding figures, and would cooperate with the same type of variable condenser as shown therein. In that instance, the plunger 14' as before, has a vertical extension 22', at the top of which there is pivoted a similar saddle 40'. The saddle as before, extends downwardly on each side of the vertical extension 22' and has cross straps 44' which tend to hold the arcuate cam 36' on its seat 26'. In this instance, however, the plunger 14' is provided with an opening 80 in which there is mounted a compression spring 82, one end of which engages a washer 84 mounted in the end of the slot 80, and the opposite end of which engages both sides of the saddle 40'. This then tends to force the saddle in a clockwise direction about its pivot, as shown in Figure 7, and therefore tends to maintain the cam 36' locked against its arcuate seat 26'.

The plunger 14' is also provided with a suidable member 85, which slides in a slot 87, and has extending ears projecting on both sides of the slot. This member is then bent backward parallel to the plunger and then again in the nature of a U-shape, the two portions extending vertically to the plunger, being provided with openings 86 and 88, through which a small rod 90 projects, which rod carries on its outer end a push button 92. A set screw 94 is provided to hold the U-shaped member on rod 90 in a given position. The end of the plunger 14' is provided with a plate 89 through which the rod 90 projects and between this plate 89 and the downwardly extending leg of the member 85 there is a second compression spring 91. This rod 90 extends through openings 86 and 88 and carries in threaded relation on its inner end a diagonal plate 96 one end of which presses against the low extremity of the saddle 40', and the upper end of which presses against the surface of the slideable member 85.

In this form, therefore, as the push button is forced in the plunger will immediately move to carry the cam 36' against the horizontal members 32 of the condenser, until both projections 38' engage the horizontal parts. This tunes the set as before. If we now wish to reset, additional pressure causes the member 85 to be moved with relation to the plunger 14', which additional inward travel is imported through plate 96 with the resultant leverage to the lower end of the saddle 40' which then tends to move the saddle in a counter-clockwise or unlocking direction. When sufficient pressure is applied, the force of spring 82 is overcome and the cam 36' is unlocked for movement to another position. Upon tuning the set to such position and removal of the push button pressure, the device is now locked in the new position to tune in some other station.

A second modified form of plunger and locking means is shown in Figures 9 and 10, in which the plunger 14'' is as before provided with an upstanding arm 22'', but in this instance there is applied on each side a short strip 112, which carries pivots 98 for the saddle 100. Each of the saddle arms on opposite sides are connected by a cross strip 102, which maintains the cam 36'' on its arcuate seat 26''. The ends of the saddle which extend down over the plunger are again provided with openings 104 within which an adjustable block 106 is mounted, which block can be moved longitudinally of the plunger by a rod 108, which is connected to a push button (not shown). A relatively strong coil compression spring 110 is fitted in an aperture in the plunger and engages the lower end of the saddle to tend to move it in a clockwise or locking direction around its pivot. In this case as in previous cases, initial movement of the plunger actuated by a push button causes engagement of the cam 36'' with the horizontal bars 32 of the condenser for tuning. Additional pressure, however, overcomes the force of the spring 110 to release the arcuate cam 36'' for resetting purposes.

We claim:

1. In tuning means for a radio receiver, rotatable means for tuning said receiver to different stations, reciprocable means mounted for movement toward said rotatable means, an adjustable cam on said reciprocable means, pivotal frictional locking means for said cam, spring biasing means to maintain said locking means in locked position, shaft means rotatably mounted on the side of the reciprocable means and threadedly engaging said locking means at the inner end to move the locking means upon shaft rotation, said outer end being provided with coarse spiral threads and manually engageable means slideably mounted on said reciprocating means and having an internal threaded surface surrounding the spiral threads so that upon relative movement of the two the shaft will turn and unlock the locking means.

2. In a slideable assembly carrying an adjustably positionable actuating cam, locking means for the cam mounted on said assembly, rotatable actuating means for the locking means rotatably mounted on said assembly and manually engageable slideable means mounted on said assembly and moveable relative thereto interconnected in driving relation with the rotatable actuating means to cause rotation of the latter upon relative reciprocation of the former to lock and unlock said cam.

3. In a slideable assembly carrying an adjustably positionable actuating cam, locking means for the cam mounted on said assembly, rotatable actuating means for the locking means rotatably mounted on said assembly, manually engageable slideable means mounted on said assembly and moveable relative thereto interconnected in driving relation with the rotatable actuating means to cause rotation of the latter upon relative reciprocation of the former to lock and unlock said cam, and spring biasing means between the manually engageable means and the assembly to tend to cause the whole to move together but which upon application of additional pressure permits relative motion between the parts and causes the locking means to be actuated.

4. In tuning means for a radio receiver, rotatable means for tuning said receiver to different stations, an assembly mounted for reciprocatory motion toward said rotatable means, said assembly consisting of a bar, a cam adjustably mounted on said bar and adapted to engage the rotatable means upon travel toward the same, locking means for the cam, means rotatably mounted on said bar connected to the locking means to actuate the same upon rotation, manually engageable means mounted on said bar for limited relative movement therewith interconnected with said rotatable means on said bar to rotate the same when relative motion occurs between the manually engageable means and the bar to lock or unlock the cam and spring biasing means to restrain relative motion between the manually engageable means and the bar so that under normal pressure they will move as a unit.

BERTRAM A. SCHWARZ.
LUDWIG J. FICHTER.

REFERENCES CITED

The following references are of record in the file of this patent:

UNITED STATES PATENTS

| Number | Name | Date |
|---|---|---|
| 2,266,711 | Crosby et al. | Dec. 16, 1941 |
| 2,285,102 | Teaf | June 2, 1942 |